(12) United States Patent
Smith

(10) Patent No.: US 6,300,149 B1
(45) Date of Patent: Oct. 9, 2001

(54) INTEGRATED CIRCUIT DEVICE MANUFACTURE

(75) Inventor: Charles Gordon Smith, Cambridge (GB)

(73) Assignee: Cavendish Kinetics Limited (GB)

( * ) Notice: Subject to any disclaimer, the term of this patent is extended or adjusted under 35 U.S.C. 154(b) by 0 days.

(21) Appl. No.: 09/242,037

(22) PCT Filed: Aug. 6, 1997

(86) PCT No.: PCT/GB97/02093

§ 371 Date: Feb. 5, 1999

§ 102(e) Date: Feb. 5, 1999

(87) PCT Pub. No.: WO98/06132

PCT Pub. Date: Feb. 12, 1998

(30) Foreign Application Priority Data

Aug. 6, 1996 (GB) .................................................. 9616540

(51) Int. Cl.[7] .................................................. H01L 21/66
(52) U.S. Cl. .............................. 438/15; 438/14; 438/107; 438/455
(58) Field of Search .............................. 438/15, 14, 107, 438/455

(56) References Cited

U.S. PATENT DOCUMENTS

| | | |
|---|---|---|
| 4,194,668 | 3/1980 | Akyurek . |
| 4,810,653 * | 3/1989 | Helfer et al. .......................... 435/316 |
| 4,902,624 * | 2/1990 | Columbus et al. ................... 435/316 |
| 4,990,462 | 2/1991 | Sliwa, Jr. . |
| 5,038,852 * | 8/1991 | Johnson et al. ......................... 165/12 |
| 5,333,675 * | 8/1994 | Mullis et al. ........................... 165/12 |
| 5,355,577 | 10/1994 | Chon . |
| 5,460,780 * | 10/1995 | Devaney, Jr. et al. ................. 422/99 |
| 5,589,136 * | 12/1996 | Northrup et al. ...................... 422/102 |
| 5,656,493 * | 8/1997 | Mullis et al. .......................... 435/286 |
| 5,928,907 * | 7/1999 | Woudenberg et al. ............. 435/91.2 |

FOREIGN PATENT DOCUMENTS

| | | | |
|---|---|---|---|
| 0 436 995 A2 | * | 7/1991 | (EP) . |
| 0 579 924 A1 | | 5/1993 | (EP) . |
| 0 545 736 A2 | * | 6/1993 | (EP) . |
| 0 603 411 A1 | * | 6/1994 | (EP) . |
| 0 606 961 A1 | * | 7/1994 | (EP) . |
| 0 662 345 A1 | * | 7/1995 | (EP) . |
| 0 693 560 A2 | * | 1/1996 | (EP) . |
| WO 91/00683 | | 1/1991 | (WO) . |
| WO 95/17005 | | 6/1995 | (WO) . |

OTHER PUBLICATIONS

Wilson Poon, et al., "Colloids in Suspense", Physics World, Apr. 1996, vol. 9, No. 4, pp. 27–30.
D.J.W. Aastuen, et al., "Nucleation and Growth of Colloidal Crystals", Physical Review Letters, Oct. 1986, vol. 57, No. 14, pp. 1733–1736.
M. Trau, et al., "Field–Induced Colloid Crystals", Science, May 3, 1996, vol.272, pp. 706–709.
T. Okubo, "Another Look at the Melting Temperature of Colloidal Crystals in the Completely Deionized Suspension", Colloid & Polymer Science, 1994, pp. 440–445.
Physics World, "Liquids New Solutions to Old Problems", Apr. 1996.
Wittwer, et al., "The LightCycler™: A Microvolume Multisample Fluorimeter with Rapid Temperature Control", *Bio Techniques* 22:176–181 (Jan. 1997).*

* cited by examiner

Primary Examiner—Kevin M. Picardat
(74) Attorney, Agent, or Firm—Cantor Colburn LLP

(57) ABSTRACT

A method of manufacturing an integrated circuit device from a plurality of physically separate individual electrical elements comprises manufacturing each of the plurality of elements and verifying the operability of each of the elements. Inoperable elements are discarded and he operable elements retained in a fluid. The retained elements are aligned so that each element is adjacent to at least one other element and the arrangement of elements treated to provide connections therebetween and thereby to produce a single integrated circuit device.

29 Claims, 7 Drawing Sheets

(a)

(b)

INTEGRATED CIRCUIT DEVICE MANUFACTURE

The present invention relates to a method of manufacture of an integrated circuit device such as a memory device of the semiconductor type, together with the resultant product thereof.

In recent years large advances have been made in the area of integrated circuit and semiconductor memory device manufacture, resulting in the widespread availability of devices of ever increasing capacity and ever reducing cost. There are, however, significant problems associated with such device manufacture. Currently available semiconductor memory devices, for example, can have in the region of $100 \times 10^6$ individual elements contained within them. The control of such devices requires that each of these elements to work. With each element having sub-micron dimensions, the possibility of having a manufacturing error is substantial. One defect, unwanted dust particle, or miss-aligned region can result in the production of a worthless device. This means that, as individual element size drops and the number of elements increases, the yield from the manufacturing process either drops exponentially or there must be exponential improvements in manufacturing process control. This has led to a significant increase in the cost of semiconductor memory device fabrication facilities.

A further disadvantage with the processes involved in the manufacture of current integrated circuit devices is that such devices must be formed from elements which are formed on a single substrate and in a single plane. This means that it is not possible to stack more than a few layers individual elements, and that the dimensions of the device must be increased in the single plane if overall device capacity is to be increased.

The present invention seeks to provide a solution to the above problems.

According to the present invention there is provided a method of manufacturing an integrated circuit device from a plurality of physically separate individual electrical elements, the method comprising the steps of:

manufacturing each of said plurality of elements;

verifying the operability of each of said elements and discarding inoperable elements;

retaining the operable elements;

aligning the retained elements so that each element is adjacent to at least one other element; and treating the arrangement of elements to provide connections therebetween and thereby to produce a single integrated circuit device.

The elements may be retained in a fluid.

The treatment may involve drying the arrangement of elements to remove any retained fluid. The treatment step may then involve the further steps heating and then cooling of the elements to melt electrical contacts formed thereon to bring them into engagement with electrical contacts on adjacent elements. An alternative is to place the arranged elements in a chemical plating solution to increase the metal volume until they make contact with each other or a patterned substrate. A further alternative is to remove a surface coating formed on the elements to enable direct electrical contact. In a preferred embodiment, each of the elements is formed with a width less than 1 micron for three dimensional alignment, although in two dimensional alignment larger elements can be used.

The elements may be formed from semiconductor material, and may be memory elements, forming, as a result, in a semiconductor device.

The elements may be aligned in a single plane or in a stacked arrangement. The alignment may constitute two steps, an initial alignment of elements into a lattice, followed by directional alignment of the elements, or directional alignment followed by alignment into a lattice. The lattice alignment may be performed by employment of magnetic or electrostatic forces or by employment of colloidal chemistry techniques. Each of the plurality of elements may be formed so that is has a symmetrical shape to ensure ease of alignment. This may require each element to have some redundant features.

The fluid may be a de-ionized solution. The lattice alignment may be performed by increasing the concentration of elements held in the fluid until the elements align in a periodic crystal-like structure, which may be a high entropy structure. With this approach, the elements may need to be coated to overcome Van Der Waals forces, and the coating may provide the elements with charged surfaces.

The elements may be formed so that they are polarised or coated in order to ensure mutual attraction, or are magnetically attracted to one another or so that they are aligned by an external magnetic or electric field so that directional alignment can be performed.

The present invention also provides a device produced by the above method.

One example of the present invention will now in described with reference to the accompanying drawings, in which.

Figure 1:
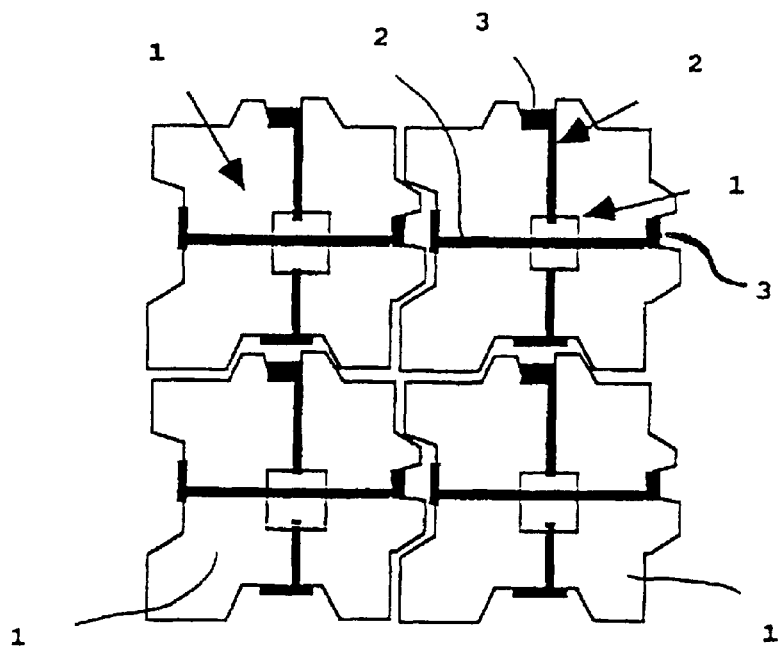
FIG. 1 is a schematic view of elements aligned in accordance with the method of the invention.

Referring to FIG. 1, the first stage of an example the method of the invention is to produce a plurality of individual elements 1 (in this example semiconductor memory elements) which are formed using standard manufacturing techniques. In the case of semiconductor elements, this may involve formation of the elements on a sacrificial layer which is then etched away. In this example, each elements represents a single semiconductor device, although each may represent more than one semiconductor device. Each of the semiconductor elements is formed with one or more connecting conducting tracks 2 which lead to conducting regions 3 on the surface of each memory element 1. These tracks 2 and regions 3 are, in this example, formed from a metal and coated with an insulator (not shown), with regions 3 being formed from a low melting temperature solder. The insulator prevents metal to metal attraction during the later alignment discussed below.

Figure 4:
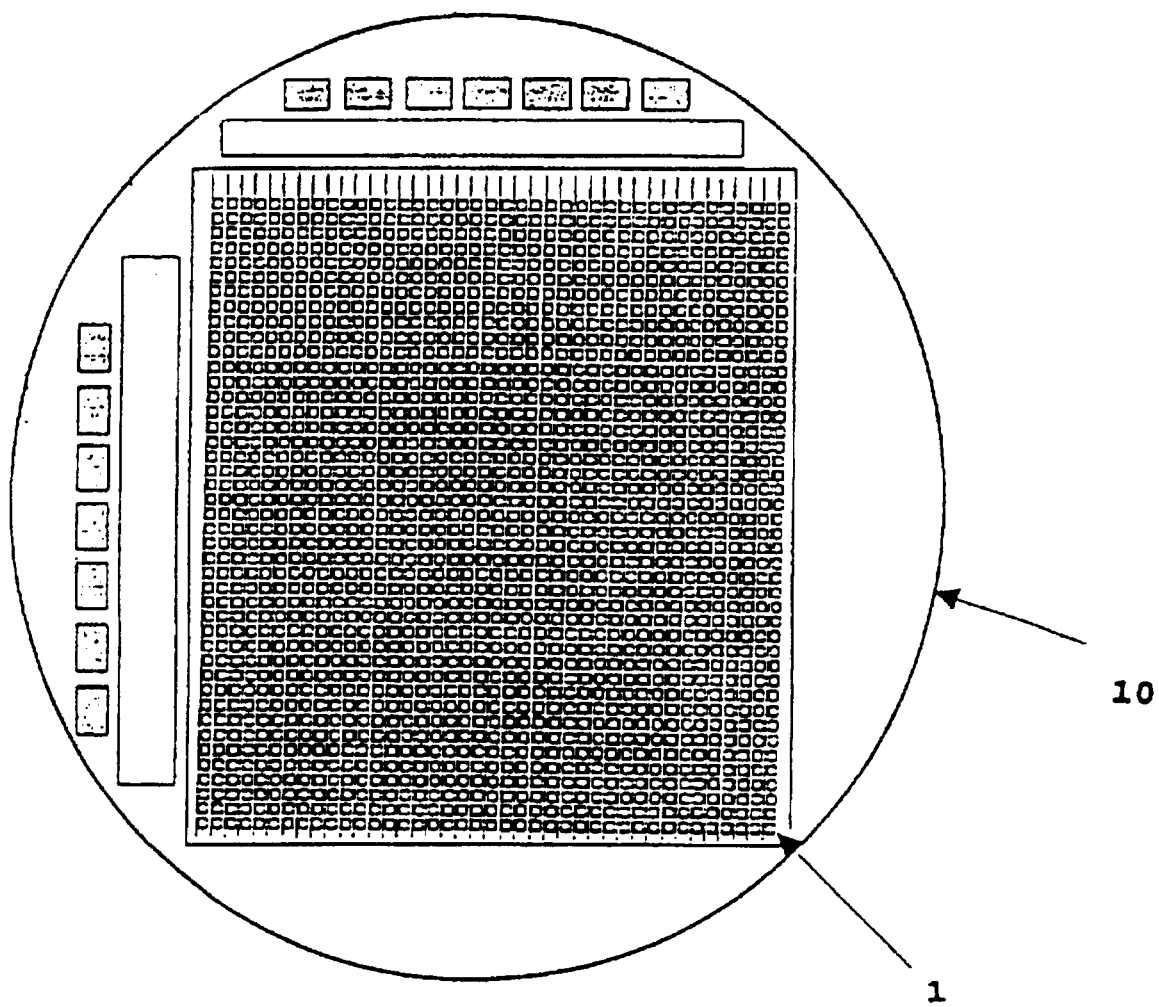
FIG. 4 is a schematic diagram showing how elements employed in the invention may be formed on a wafer.

Once the individual elements 1 are manufactured they are each tested whilst still on their original wafer 10 (FIG. 4) to confirm their operability and are then etched off (FIG. 5) and placed in a fluid, such as a de-ionised solution.

Figure 5:
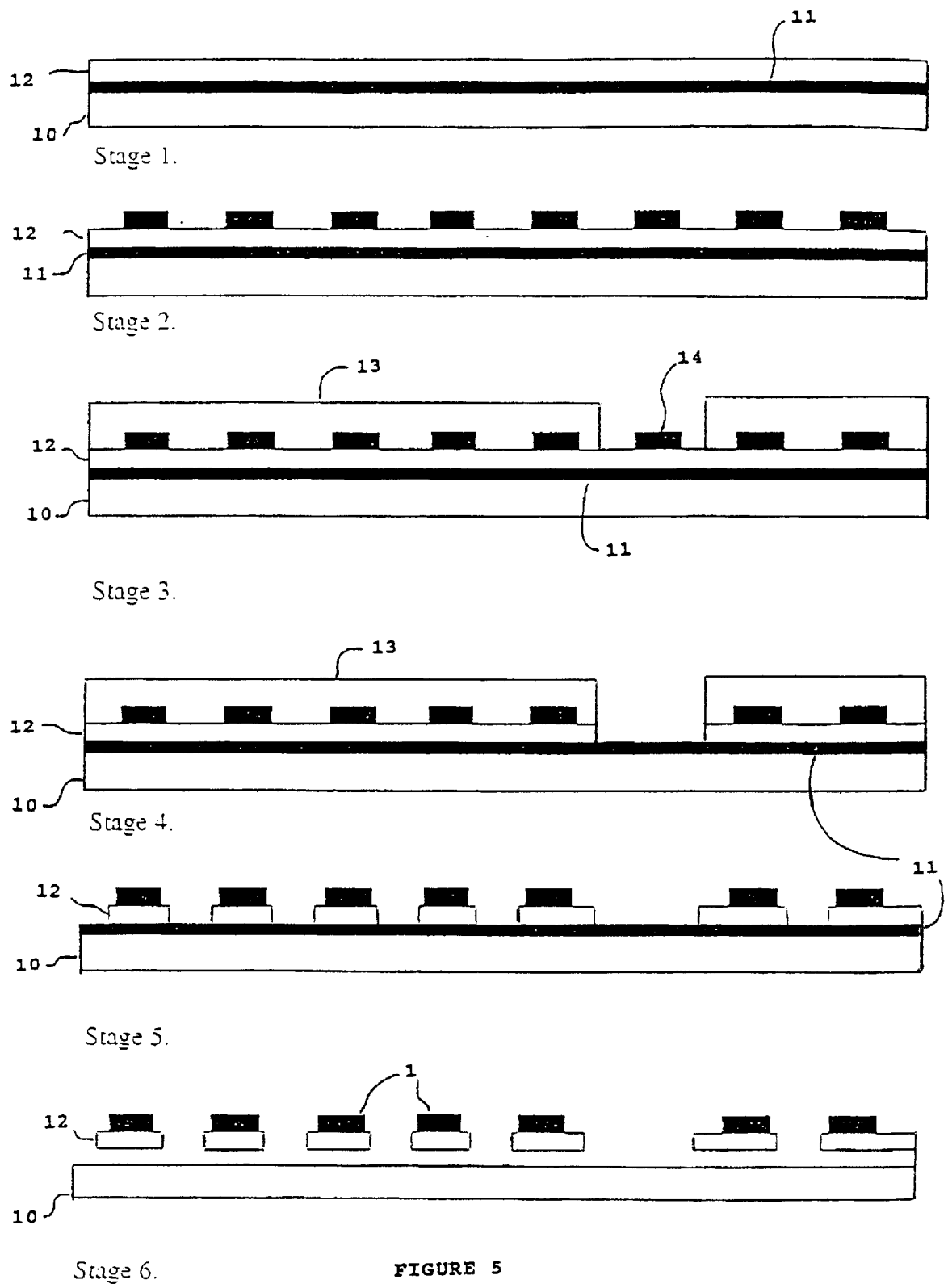
FIG. 5 is a schematic diagram showing an example production and testing process for producing elements employed in the invention.

FIG. 5 shows how elements 1 employed in the invention can be manufactured, tested and released from their original wafer 10. In a first stage a sacrificial layer 11 is formed under an active region 12 on the wafer 10. Elements 1 are then defined on the top layer of the wafer 10 and tested. A resist 13 is applied and then exposed over failed elements 14. Failed elements 14 are then etched away. Further etching removes regions of the active region 12 down to the sacrificial layer 11. The sacrificial layer 11 is then etched away to remove individual elements 1 from the wafer 10. Surfactant solutions may be used to prevent elements being attracted to each other during removal, and the fluid in which they are contained is de-ionised.

Once all the operable elements are placed in the field then lattice alignment of the individual elements 1 to place them adjacent to one another in an arrangement of the type shown in FIG. 1, is performed. A number of lattice alignment techniques are possible.

In a first example of the lattice alignment method, after the elements 1 are placed in the fluid, the concentration of the elements is increased and/or the ionic concentration of the solution reduced until they form a crystal lattice with high entropy.

The solution may be made in a saturated solution by increasing the concentration so that it would be sufficient for natural crystal orientation, but agitating this solution to prevent such orientation. Crystallisation can then be seeded by introduction of a patterned substrate. A method of alignment employing this technique is disclosed in "Colloids, In Suspense", pages 27 to 30, Physics World 1996 and "Physical Review Letters" (1986), Vol.57, pages 1733–1736. This lattice alignment method is particularly appropriate for use in the formation of three dimensional devices.

As mentioned above, a seed may be provided on which the crystallisation occurs. The seed can be a patterned chip with interconnects which forms the basis of a final product memory device and has a periodic structure which is the same as the resulting periodic packing of the aligned elements.

Figure 6A:
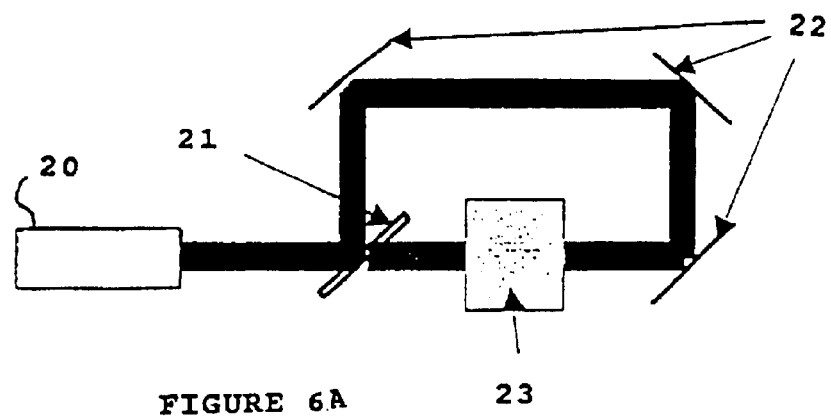
FIGS. 6A and 6B are schematic diagrams showing an apparatus and process for aligning elements employed in the invention in a fluid.
Figure 6B:
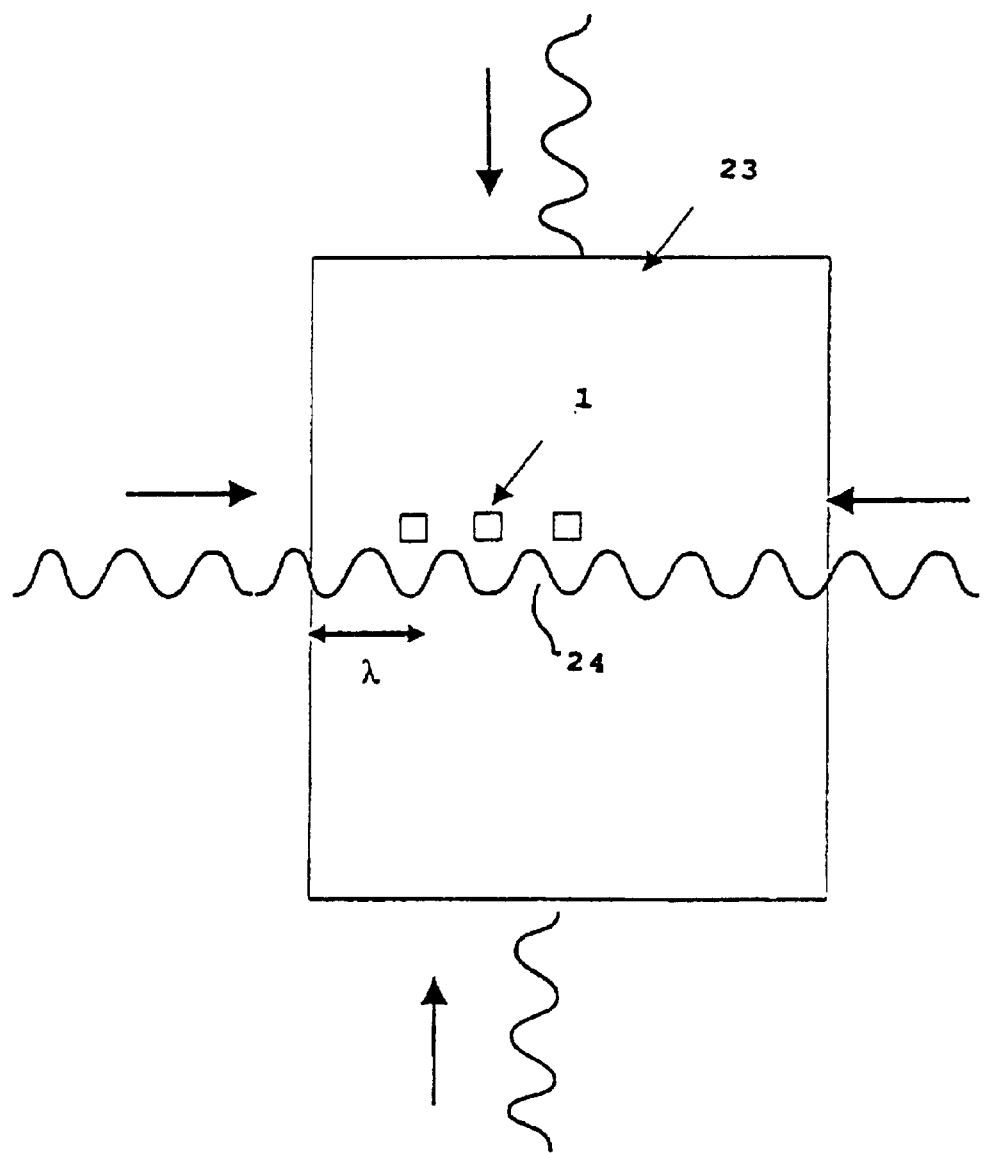

Crystallisation onto a three dimensional lattice can be improved by the use of a standing light wave produced by superimposing a forward travelling and reverse travelling laser light wave of well defined phase and wavelength. This is shown in FIG. 6, with a laser light source 20 being applied to a half-silvered mirror 21, which splits the light beam to direct it to mirror 22 and hence to either side of a container 23. The elements 1 in fluid are within the container 23 and a standing lightwave 24 is generated in the container 23. If this is performed in three orthogonal direction a periodically modulated oscillating electric field is produced which will have a three-dimensional cubic lattice symmetry. By tuning the wavelength to be comparable to the lattice period, the elements are further aligned.

Figure 3:
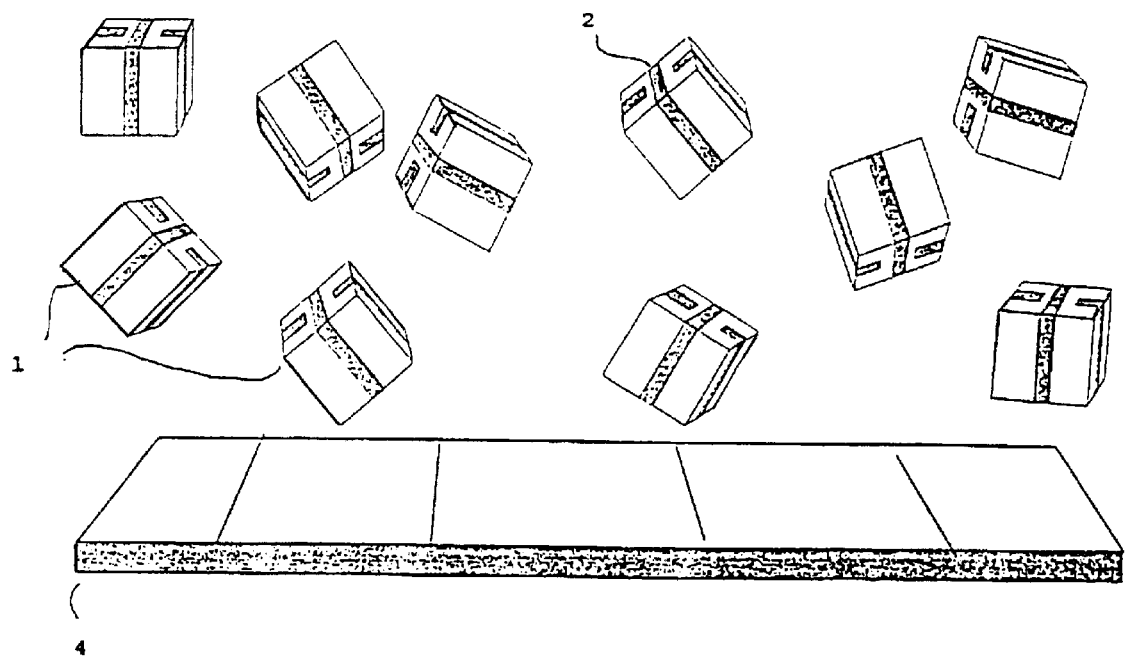
FIG. 3 is a schematic diagram of an example lattice alignment method employed in the invention.
Figure 3:
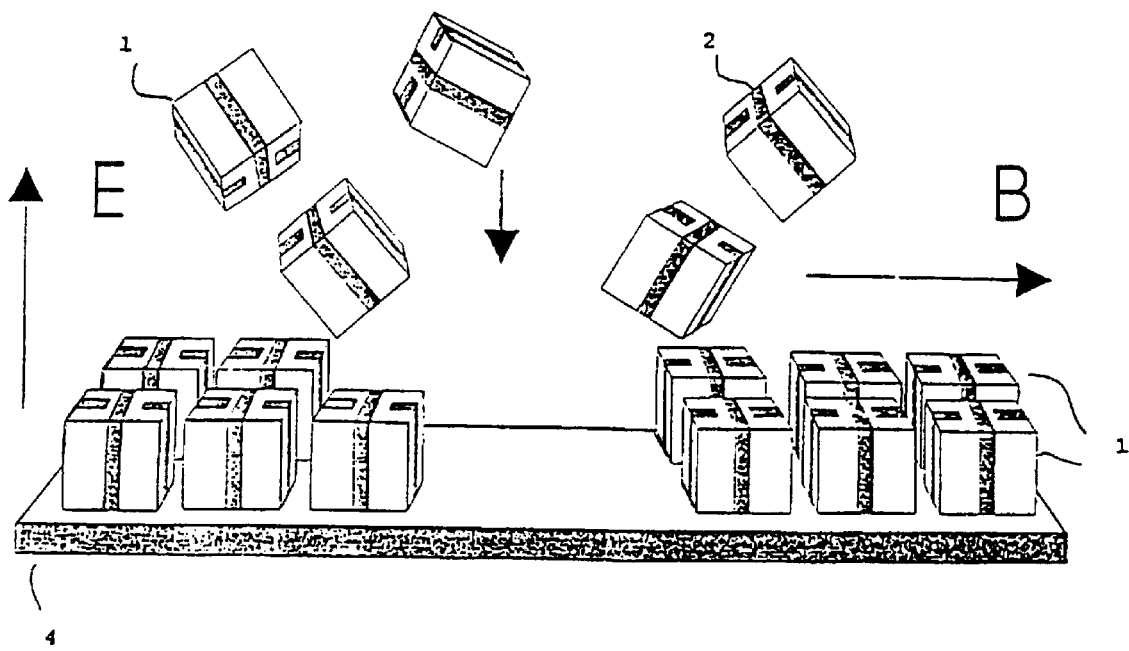

In a second example, electrohydrodynamic properties of the elements 1 are expicited. In this second example, shown in FIG. 3, a substrate 4, which forms the interconnect base of the device being manufactured is provided. Fluid containing a low concentration of elements 1 is then passed over the surface of the substrate 4 and elements 1 attain themselves thereto by application of an electric field. This technique is particularly useful in the formation of two dimensional devices, and allows different layers to be built up, the properties of each layer being determined by the type of fluid and concentration of elements 1 provided. A method of alignment employing this technique is discussed in "Field Induced Layering of Colloidal Crystals", pages 706–709, Science, Volume 272, May 1996.

Figure 7:
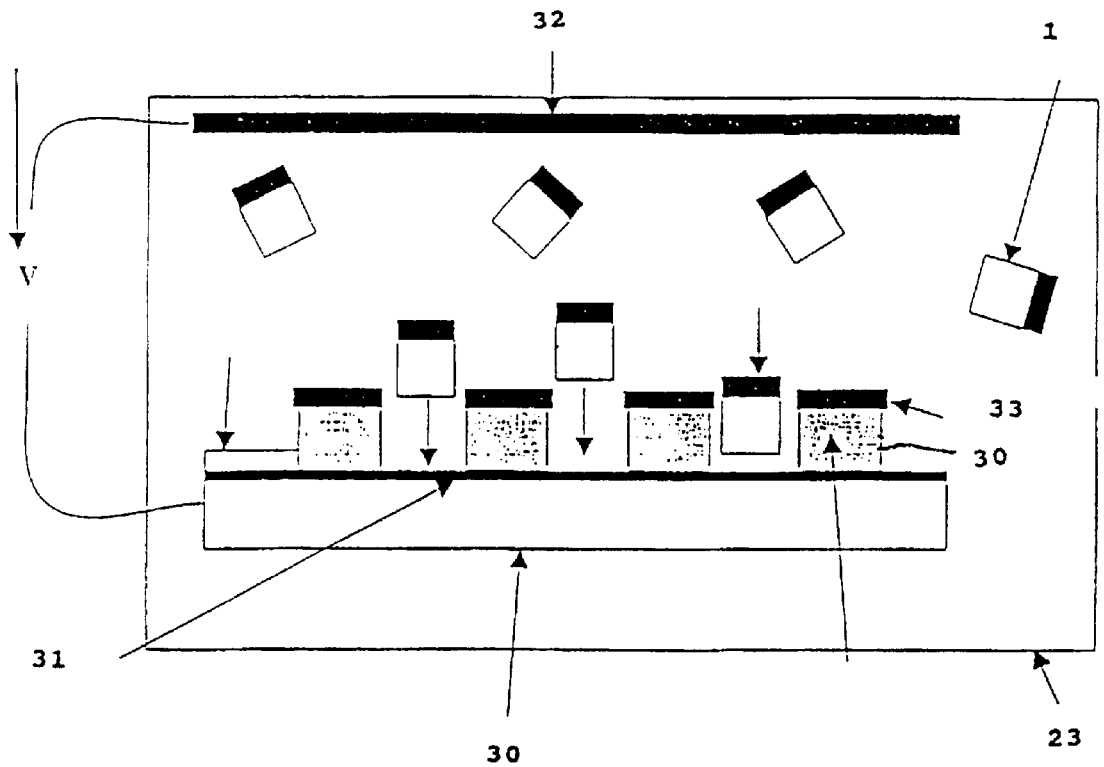
FIG. 7 is a schematic diagram showing a second example alignment method employed in the invention.
Figure 7:
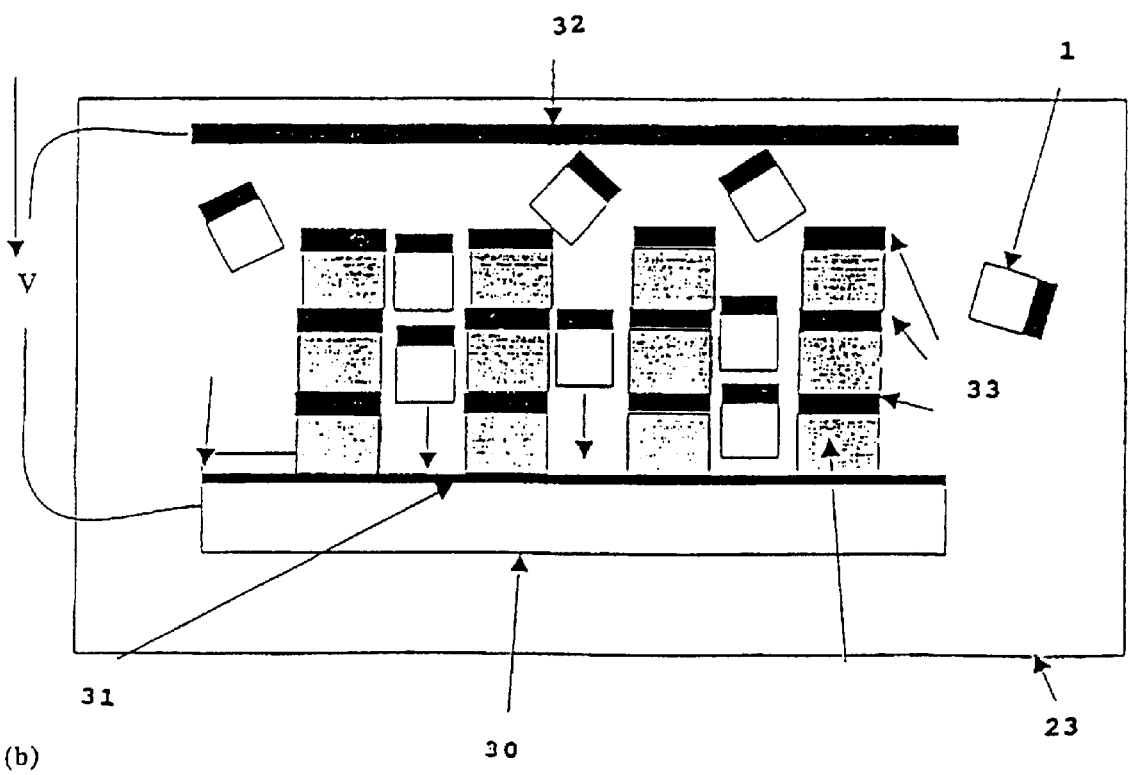

The substrate 4 may have an insulating layer or layers 30 (FIG. 7) which is patterned with holes down to a conducting layer 31. When an electric field is applied between the conductive layer 31 and a conducting layer 32 on the surface of the insulating layer 30, elements 1 are drawn down into the holes in the insulating layer 31 by hydrodynamic forces. Plural layers of insulating material 30 may be provided separated by alternate layers of metal 33, which can, in the finished product, provide address electrodes for the aligned elements. With plural insulating layer 30, plural elements 1 can be drawn down to form ordered stacks of elements 1. The holes and elements 1 may be shaped so that the elements 1 can only pass down holes with a given alignment.

Figure 8:
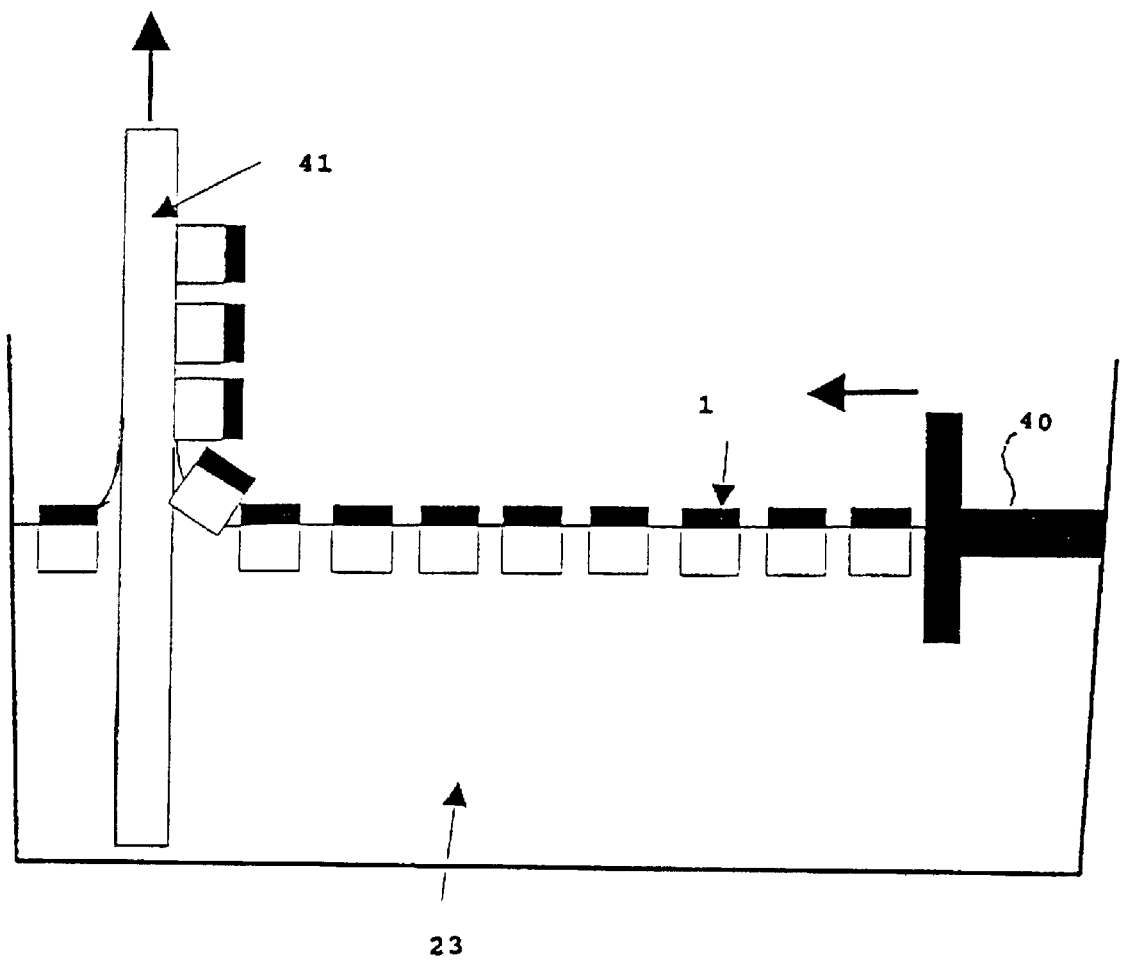
FIG. 8 is a schematic diagram showing a third example alignment method employed in the invention.

The further technique is shown in FIG. 8. In this technique, elements 1 are coated with a hydrophobic layer and a hydrophillic layer. The elements 1 can then be floated on the surface of a liquid, such as water. A movable bar 40 may be provided on the surface of the water to control element concentration. A substrate 41 may be pulled through the surface of the liquid whilst the bar 40 is moved towards it to maintain a container element concentration on the surface of the liquid and to enable the substrate to draw up elements to form an array. This step can be repeated to add subsequent layers. A further processing step may be required to connect the separate layers. Alternatively, the substrate may have conducting pillars which can be used to connect the subsequent layers. The substrate may also have hydrophobic and hydrophillic layers to define the regions to which elements 1 are attracted.

Before or after lattice arrangement has been performed by one of the above methods, directional alignment of individual elements 1 is required. There are several techniques that may be employed to perform this directional alignment.

In a first example directional alignment method, each of the elements have magnetic material applied to one surface, making them attract one another, with appropriate surfaces being attracted to one another to form the correct alignment. The magnetic material may be applied using a standard metallisation technique or similar application process.

In a second example, each of the elements 1 are manufactured with a region which is electrically or magnetically polarised which is employed to align elements 1 by application of an external aligning electric or magnetic field.

The element-element repulsion is controlled by colloidal chemistry to be larger than the element-element attraction due to electrostatic or magnetic dipole-dipole attraction.

In a third example, alignment is performed by providing each of the elements 1 with coatings of differing materials on the different surfaces of the individual elements 1. Each of the materials has differing adhesion properties and create surfaces having differing Van Der Waals forces. These differing properties create artificial bonds which lead to alignment of the elements 1 in a particular direction when the temperature of the lattice arrangement, ionic concentration, element concentration or agitation is altered.

In all the above examples, there is a probability of defects forming within the arrangement that will result in an un-usable product. Defects can be reduced by performing the process in micro-gravity (i.e. by manufacture in earth orbit), for example or by a sheer gradient which would melt the crystal at the high sheer velocity region whilst the low sheer velocity region remains as a crystal. Using this technique the crystallisation front can be made to move at a controlled speed and direction. This removes disorder in the packing. The use of a standing lightwave or, alternatively, a standing acoustic wave, is possible at this stage to improve crystal structure.

A further alignment technique that may be used is to compress the solution of elements 1 between a glass plate a patterned substrate. The gap between the glass plate and substrate be used to control the crystal lattice structure from a triangular lattice to a square lattice (see Pawel Contemporary Physics, 1983, Volume 24, Section 6).

Figure 2:
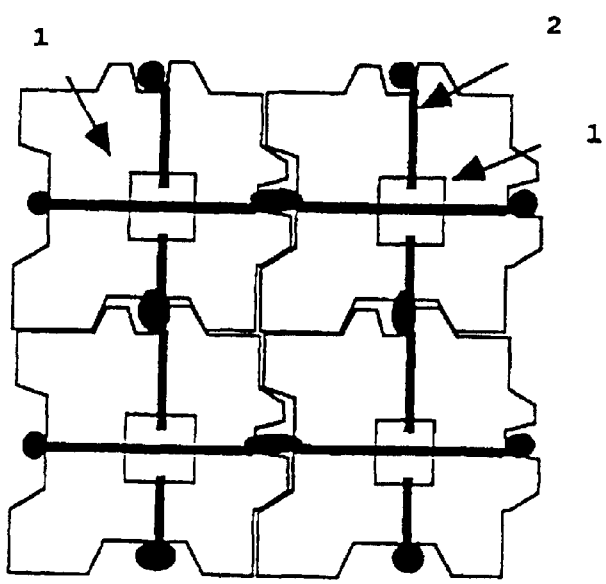
FIG. 2 is a schematic plan view of a memory device formed according to the present invention.

Once the directional alignment stage is completed, using any of the above examples, the aligned elements are heated to a temperature at which the conductor regions 3 melt and, due to surface tension effects, come into contact with adjacent conductive regions 3. The elements are then cooled to allow the conductive regions 3 to set and form proper electrical bonds between one another, as shown in FIG. 2.

In another embodiment the lattice may be housed in chemical plating solutions which increases the volume of the metal region so that they make sufficient electrical contact with each other.

Alternatively, the elements 1 may be addressed by means other than direct electrical contact. Information may be passed and retrieved from them by use of electromagnetic radiation. In the case of a memory element the state of the element may be detected by shining light of a given frequency at the element and detecting if the light is absorbed. In a different case, measurement may be based upon the secondary omission of light, which may have a different frequency. In another example each element comprises circuitry capable of holding its own address so that the whole crystal is illuminated and only the element being addressed responds. In another alternative, the light can be focused onto a given element, which may require two light beams. In this embodiment, the combined amplitude is greater than a threshold value only for the element focused on by the two beams. If two beams are employed it is possible to have beams of different light frequencies, the light only being activated by light of these two frequencies impinged together. It will be appreciated that this could be extended to three beams with each beam being focused on only one plane, intersection of the three beams selecting the element.

What is claimed is:

1. A method of manufacturing an integrated circuit device from a plurality of physically separate individual electrical elements, the method comprising:
    manufacturing each of said plurality of elements;
    verifying the operability of each of said elements and discarding inoperable elements;
    retaining the operable elements in a fluid;
    aligning the retained elements so that each element is adjacent to at least one other element the alignment comprising, arrangement of elements into a lattice by employment of colloidal chemistry techniques, and directional alignment of the elements so that each element has the desired orientation with respect to the other elements; and
    treating the arrangement of elements to provide connections therebetween and thereby to produce a single integrated circuit device.

2. A method according to claim 1, wherein treating the arrangement of elements includes heating and then cooling of the elements to melt electrical contacts formed thereon to bring them into engagement with electrical contacts on adjacent elements.

3. A method according to claim 1, wherein treating the arrangement of elements includes metal plating of the elements to form connections therebetween.

4. A method according to claim 1, wherein treating the arrangement of elements includes drying the arrangement of elements to remove any retained fluid.

5. A method according to claim 1, wherein treating the arrangement of elements includes the removal of a surface coating formed on the elements to enable direct electrical contact.

6. A method according to any of claim 1, wherein each of the elements are generally cuboid and formed with a width less than 1 micron.

7. A method according to any of claim 1, wherein the elements are formed from semiconductor material.

8. A method according to any of claim 1, wherein the elements are memory elements.

9. A method according to any of claim 1, wherein the elements are aligned in a single plane.

10. A method according to any of claim 1, wherein the elements are aligned in a stacked arrangement.

11. A method according to claim 1, wherein the directional alignment is performed by employment of magnetic or electrostatic forces.

12. A method according to claim 1, wherein each of the plurality of elements are formed so that they have a symmetrical shape.

13. A method according to claim 12, wherein the elements have redundant features to provide symmetry.

14. A method according to claim 1, wherein the fluid is a de-ionized liquid.

15. A method according to claim 1, wherein the lattice alignment is performed by increasing the ratio of element concentration to fluid until the elements align in a high entropy structure.

16. A method according to claim 15, wherein the elements are coated to overcome Van Der Waals forces.

17. A method according to claim 1, wherein the elements are formed so that they are polarised or coated in order to increase their mutual attraction.

18. A method according to claim 1, wherein the elements are formed so as to be attracted by an externally applied force.

19. A method according to claim 1, wherein the elements are arranged to have differing attractive forces on differing areas of each element to provide spontaneous alignment of elements as the ratio of element concentration to fluid is increased.

20. A method according to claim 1, wherein the elements are coated so that there are electrically or magnetically polarised to aid alignment.

21. A method according to claim 1, wherein alignment the retained elements includes applying standing light or sound waves to the fluid, the standing light or sound waves having a period substantially the same as the spacing of the element lattice to be formed.

22. A method according to claim 1, wherein alignment the retained elements includes:
    floating the elements on the surface of a liquid; and
    drawing a substrate through the surface of the liquid to draw elements onto the surface of the substrate.

23. A method according to claim 1, wherein the alignment of the elements to a substrate is aided by the employment of standing periodic mechanical vibration applied to the substrate.

24. A method according to claim 1, wherein the elements are shaped so that they can only pack together closely in one orientation.

25. A method according to claim 1, wherein the elements are addressed by using electromagnetic radiation.

26. A method according to claim 1, wherein the connections between elements are electrical connections.

27. A method according to claim 1, wherein the method further includes connecting layers of arranged elements.

28. A method according to claim 1, wherein the elements are aligned on a substrate having conductive pillars arranged on its surface, the pillars being used to connect separate layers of elements.

29. A device produced by the method of claim 1.

* * * * *